(12) United States Patent
Birang et al.

(10) Patent No.: US 8,216,441 B2
(45) Date of Patent: Jul. 10, 2012

(54) ELECTROPHORETIC SOLAR CELL METALLIZATION PROCESS AND APPARATUS

(75) Inventors: Manoocher Birang, Los Gatos, CA (US); Kapila P. Wijekoon, Palo Alto, CA (US); Alexander Sou-Kang Ko, Santa Clara, CA (US); Eugene Rabinovich, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1155 days.

(21) Appl. No.: 11/953,357

(22) Filed: Dec. 10, 2007

(65) Prior Publication Data
US 2009/0145760 A1 Jun. 11, 2009

(51) Int. Cl.
*C25D 1/12* (2006.01)
(52) U.S. Cl. ........................ 204/622; 204/624
(58) Field of Classification Search .............. 204/622, 204/624
See application file for complete search history.

(56) References Cited

U.S. PATENT DOCUMENTS

| | | | |
|---|---|---|---|
| 5,041,169 A | 8/1991 | Oddy et al. | |
| 5,223,033 A | 6/1993 | King et al. | |
| 5,225,110 A | 7/1993 | Kathirgamanathan | |
| 5,382,299 A | 1/1995 | Baluch et al. | |
| 5,782,945 A | 7/1998 | Gavin et al. | |
| 5,817,374 A | 10/1998 | Detig et al. | |
| 5,874,124 A | 2/1999 | Adebayo et al. | |
| 6,110,632 A | 8/2000 | Dunford et al. | |
| 6,153,348 A | 11/2000 | Kydd et al. | |
| 6,274,412 B1 | 8/2001 | Kydd et al. | |
| 6,838,372 B2 | 1/2005 | Gilleo | |
| 6,951,666 B2 | 10/2005 | Kodas et al. | |
| 7,079,305 B2 | 7/2006 | Paolini, Jr. et al. | |
| 7,252,749 B2 | 8/2007 | Zhou et al. | |
| 7,298,543 B1 | 11/2007 | Tam et al. | |
| 2002/0187277 A1* | 12/2002 | Louks et al. | 427/472 |
| 2005/0093938 A1* | 5/2005 | Yang et al. | 347/78 |
| 2005/0100735 A1 | 5/2005 | Arora et al. | |
| 2005/0106329 A1* | 5/2005 | Lewis et al. | 427/457 |
| 2006/0192182 A1 | 8/2006 | Khaselev et al. | |
| 2006/0260943 A1 | 11/2006 | Khaselev et al. | |
| 2009/0178927 A1* | 7/2009 | Wijekoon et al. | 204/471 |

* cited by examiner

*Primary Examiner* — Bruce Bell
(74) *Attorney, Agent, or Firm* — Patterson & Sheridan, LLP

(57) ABSTRACT

Embodiments of the invention provide a novel apparatus and methods for forming a contact structure having metal lines formed using an electrophoretic deposition process. A substrate having a conductive or semiconductive layer is covered with an insulating layer and patterned to expose the conductive or semiconductive layer. The substrate is exposed to a processing medium comprising charged particles immersed in a dielectric fluid. An electric field is optionally applied. The charged particles deposit onto the exposed portions of the substrate and are then solidified in a reflow process.

5 Claims, 10 Drawing Sheets

ELECTROPHORETIC SOLAR CELL METALLIZATION PROCESS AND APPARATUS

BACKGROUND OF THE INVENTION

1. Field of the Invention

Embodiments of the present invention generally relate to the fabrication of photovoltaic cells and particularly to the formation of layers on a substrate by use of an electrophoretic metallization process.

2. Description of the Related Art

Solar cells are photovoltaic devices that convert sunlight directly into electrical power. The most common solar cell material is silicon, which is in the form of single or polycrystalline substrates. Because the amortized cost of forming silicon-based solar cells to generate electricity is higher than the cost of generating electricity using traditional methods, there has been an effort to reduce the cost to form solar cells.

FIGS. 1A and 1B schematically depict a standard silicon solar cell 100 fabricated on a substrate 110. The substrate 110 includes a p-type base region 101, an n-type emitter region 102, and a p-n junction region 103 disposed therebetween. An n-type region, or n-type semiconductor, is formed by doping the semiconductor with certain types of elements (e.g., phosphorus (P), arsenic (As), or antimony (Sb)) in order to increase the number of negative charge carriers, i.e., electrons. Similarly, a p-type region, or p-type semiconductor, is formed by the addition of trivalent atoms to the crystal lattice, resulting in a missing electron from one of the four covalent bonds normal for the silicon lattice. Thus the dopant atom can accept an electron from a neighboring atom's covalent bond to complete the fourth bond. The dopant atom accepts an electron, causing the loss of half of one bond from the neighboring atom and resulting in the formation of a "hole".

When light falls on the solar cell, energy from the incident photons generates electron-hole pairs on both sides of the p-n junction region 103. Electrons diffuse across the p-n junction to a lower energy level and holes diffuse in the opposite direction, creating a negative charge on the emitter and a corresponding positive charge builds up in the base. When an electrical circuit is made between the emitter and the base and the p-n junction is exposed to certain wavelengths of light, a current will flow. The electrical current generated by the semiconductor when illuminated flows through contacts disposed on the frontside 120, i.e. the light-receiving side, and the backside 121 of the substrate 110. The top contact structure, as shown in FIG. 1A, is generally configured as widely-spaced thin metal lines, or fingers 104, that supply current to a larger bus bar 105. The back contact 106 is generally not constrained to be formed in multiple thin metal lines, since it does not prevent incident light from striking solar cell 100. Solar cell 100 is generally covered with a thin layer of dielectric material, such as $Si_2N_4$, to act as an anti-reflection coating 111, or ARC, to minimize light reflection from the top surface of solar cell 100.

In the interest of simplified assembly and higher efficiency of solar cells, a solar cell has been developed, wherein a plurality of holes is formed through the solar cell substrate and serves as vias for interconnection of the top contact structure to a backside conductor by using pins. This solar cell design is referred to as a pin-up module, or PUM. One advantage of the PUM concept is the elimination of the busbars, such as bus bar 105 illustrated in FIG. 1A, from covering the light-receiving side of the substrate, thereby increasing efficiency of the cell. Another is that resistive losses are reduced because current produced by the solar cell is collected at holes equally spaced over the substrate rather than requiring some of the connections to extend across the surface of the solar cell. Further, resistive losses experienced by a PUM connected device will not increase as the solar cell surface area increases and, hence, larger solar cells may be manufactured without a loss in efficiency.

FIG. 1C is a partial schematic cross section of one example of a PUM cell 130 showing a contact 134. Similar to a standard solar cell, such as solar cell 100, PUM cell 130 includes a single crystal silicon substrate 110 with a p-type base region 101, an n-type emitter region 102, and a p-n junction region 103 disposed therebetween. PUM cell 130 also includes a plurality of through-holes 131, which are formed between the light-receiving surface 132 and the backside 133 of PUM cell 130. The through-holes 131 allow the formation of contacts 134 between the light-receiving surface 132 and the backside 133. Disposed in each through-hole 131 is a contact 134, which includes a top contact structure 135 disposed on light-receiving surface 132, a backside contact 136 disposed on backside 133, and an interconnect 137, which fills through-hole 131 and electrically couples top contact structure 135 and backside contact 136. An anti-reflective coating 107 may also be formed on light-receiving surface 132 to minimize reflection of light energy therefrom. A backside contact 139 completes the electrical circuit required for PUM cell 130 to produce a current by forming an ohmic contact with p-type base region 101 of substrate 110.

The fingers 104 (FIG. 1B) or contacts 134 (FIG. 1C) are in contact with the substrate and are adapted to form an ohmic connection with doped region (e.g., n-type emitter region) 102. An ohmic contact is a region on a semiconductor device that has been prepared so that the current-voltage (I-V) curve of the device is linear and symmetric, i.e., there is no high resistance interface between the doped silicon region of the semiconductor device and the metal contact. Low-resistance, stable contacts are critical for the performance of the solar cell and reliability of the circuits formed in the solar cell fabrication process. Hence, after the fingers 104, or contacts 134, have been formed on the light-receiving surface and on the backside, an annealing process of suitable temperature and duration is typically performed in order to produce the necessary low resistance metal silicide at the contact/semiconductor interface.

Wider current-carrying metal lines (e.g., fingers 104, contacts 134) on the light-receiving surface of the solar cell yield lower resistance losses, but shadowing losses are higher due to the reduced effective surface area of the light-receiving surface. Therefore, maximizing solar cell efficiency requires balancing these opposing design constraints. FIG. 1D illustrates a plan view of one example of a top contact structure 135 for a PUM cell, wherein the finger width and geometry provide high cell efficiency. In this configuration, a top contact structure 135 for a PUM cell is configured as an electrode 138, which consists of a plurality of various width finger segments 135A. The width of a particular finger segment 135A is selected as a function of the current to be carried by that finger segment 135A. In addition, finger segments 135A are configured to branch as necessary to maintain finger spacing as a function of finger width. This minimizes resistance losses as well as shadowing by finger segments 135A.

Traditionally, the current carrying metal lines, or conductors, are fabricated using a screen printing process in which a metal-containing paste is deposited in a desired pattern on a substrate surface and then annealed to fuse the metal. Frequently, the metal used is silver. In most processes, the metal paste is mechanically applied to the substrate to fill in features formed on the substrate. The substrate is then thermally treated, or annealed, to fuse the metal into conductors. Silver is widely used for current products due to its low resistivity, but it is expensive. Further, as devices shrink, substrate thicknesses decline as well to meet design and cost constraints. Currently, substrates of thickness less than 200 micrometers (μm) are common. Use of the screen print process generates physical forces on substrates. These forces can be tolerated by thicker substrates, but substrates of thickness less than 200 μm fracture or break during the screen print process.

Therefore, there is a need for a low cost method of forming a contact structure for solar cells that has low resistivity, clearly defined features, and a strong bond and good electrical contact with the surface of the substrate.

SUMMARY OF THE INVENTION

Embodiments of the present invention generally provide an apparatus for processing semiconductor substrates comprising a substrate holder configured to position a substrate in a fixed position; a processing container having an internal surface exposed to the processing environment; and a delivery system for delivering a processing medium to the processing container, wherein the delivery system is configured to generate electrostatic charge in the processing medium.

Embodiments of the present invention further provide a method of forming conductive features on one or more conductive substrates, comprising exposing the one or more conductive substrates to a first fluid comprising a processing aid; exposing the one or more conductive substrates to a second fluid comprising a charged dielectric fluid and conductive particles suspended in the charged dielectric fluid to adhere the conductive particles to the one or more conductive substrates; and heating the one or more conductive substrates to fuse the conductive particles adhered to the one or more conductive substrates.

Embodiments of the present invention further provide a method of processing a semiconductor substrate having a front side, a back side, and conductive portions, comprising forming an insulating layer on at least one of the back side and the front side of the substrate; patterning the insulating layer on at least one of the back side and the front side of the substrate to expose conductive portions of the substrate; immersing the substrate in a dielectric fluid with bare conductive particles suspended therein; heating the substrate to fuse the bare conductive particles; and removing the insulating layer from at least one of the back side and the front side of the substrate.

Embodiments of the present invention further provide an apparatus for processing one or more substrates, comprising one or more processing stations, each of which defines a processing region; one or more substrate holders, each of which is configured to hold and transport the one or more substrates among the one or more processing stations; and a delivery system for providing one or more processing media to the one or more processing stations, wherein the delivery system is configured to generate electrostatic charge in the one or more processing media.

Embodiments of the present invention further provide a method of forming a charged dielectric suspension, comprising pumping a dielectric fluid through piping designed to generate electrostatic charge in the dielectric fluid to make a charged dielectric fluid; and dispersing a metal powder throughout the charged dielectric fluid to make a charged dielectric suspension.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

For clarity, identical reference numerals have been used, where applicable, to designate identical elements that are common between figures. It is contemplated that features of one embodiment may be incorporated in other embodiments without further recitation.

DETAILED DESCRIPTION

Embodiments of the invention contemplate the formation of a low cost solar cell using a novel deposition method and apparatus to form a metal contact structure having selectively formed metal lines using an electrophoretic deposition process. The apparatus and methods described herein remove the need to perform one or more screen printing processes to form conductive features on the surface of a solar cell substrate. Solar cell substrates that may benefit from the invention include substrates composed of single crystal silicon, multi-crystalline silicon, polycrystalline silicon, germanium (Ge), and gallium arsenide (GaAs), cadmium telluride (CdTe), cadmium sulfide (CdS), copper indium gallium selenide (CIGS), copper indium selenide (CuInSe$_2$), gallilium indium phosphide (GaInP$_2$), as well as heterojunction cells, such as GaInP/GaAs/Ge or ZnSe/GaAs/Ge substrates. The solar cell substrates may be formed in a square, rectangular, circular or any other desirable shape.

The resistance of interconnects formed in a solar cell device greatly affects the efficiency of the solar cell. It is thus desirable to form a solar cell device that has a low resistance connection that is reliable and cost effective. As noted above, silver (Ag) interconnecting lines formed from a silver paste is currently a preferred method for forming interconnects. However, while silver has a lower resistivity (e.g., 1.59×10$^{-8}$ ohm-m) than other common metals such as copper (e.g., 1.67×10$^{-8}$ ohm-m) and aluminum (e.g., 2.82×10$^{-8}$ ohm-m) it costs orders of magnitude more than these other common metals. Therefore, one or more embodiments of the invention described herein are adapted to form a low cost and reliable interconnecting layer using an electrophoretic deposition process containing a common metal, such as aluminum. However, the process may generally be used with a substantially pure metal or a metal alloy layer containing copper (Cu), silver (Ag), gold (Au), tin (Sn), cobalt (Co), nickel (Ni), zinc (Zn), lead (Pb), palladium (Pd), and/or aluminum (Al). Preferably, the conductive portion of the interconnect layer contains substantially pure aluminum, copper, or nickel.

Figure 1A:
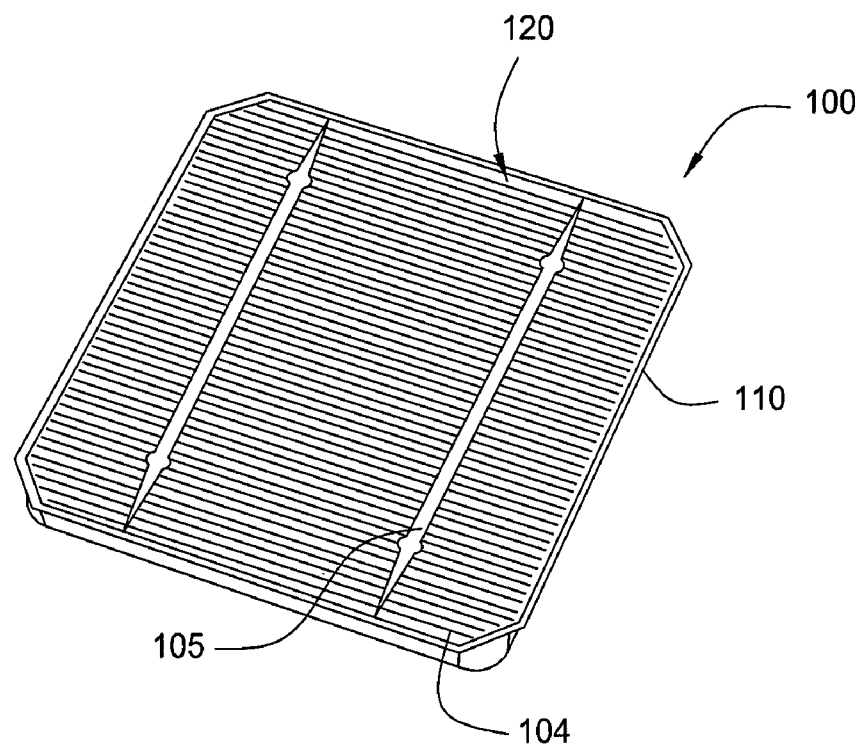
FIG. 1A illustrates an isometric view of prior art solar cell containing a front side metallization interconnect pattern.
Figure 1B:
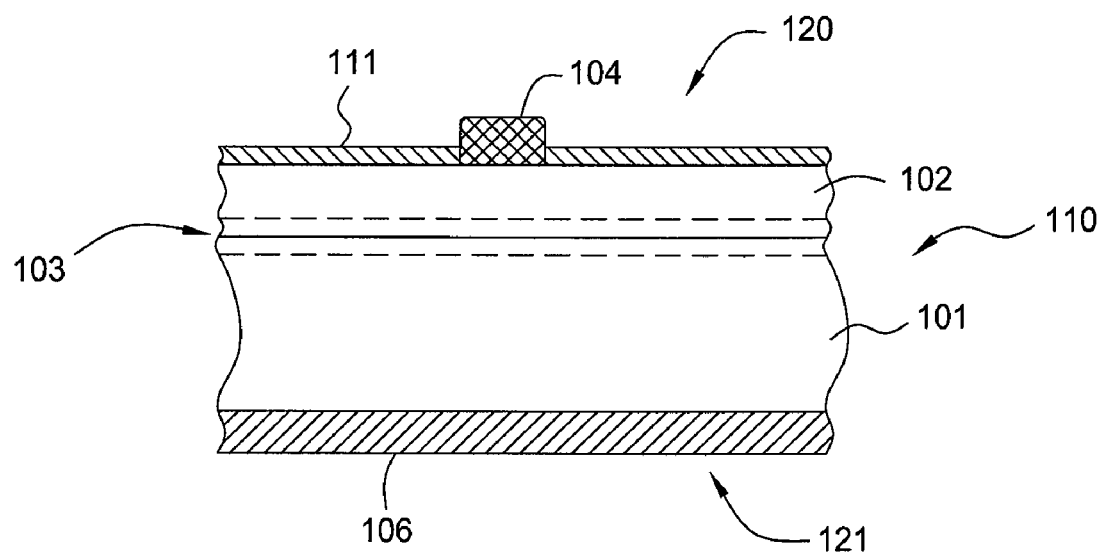
FIG. 1B illustrates a cross-sectional side view of a prior art solar cell shown in FIG. 1A.
Figure 1C:
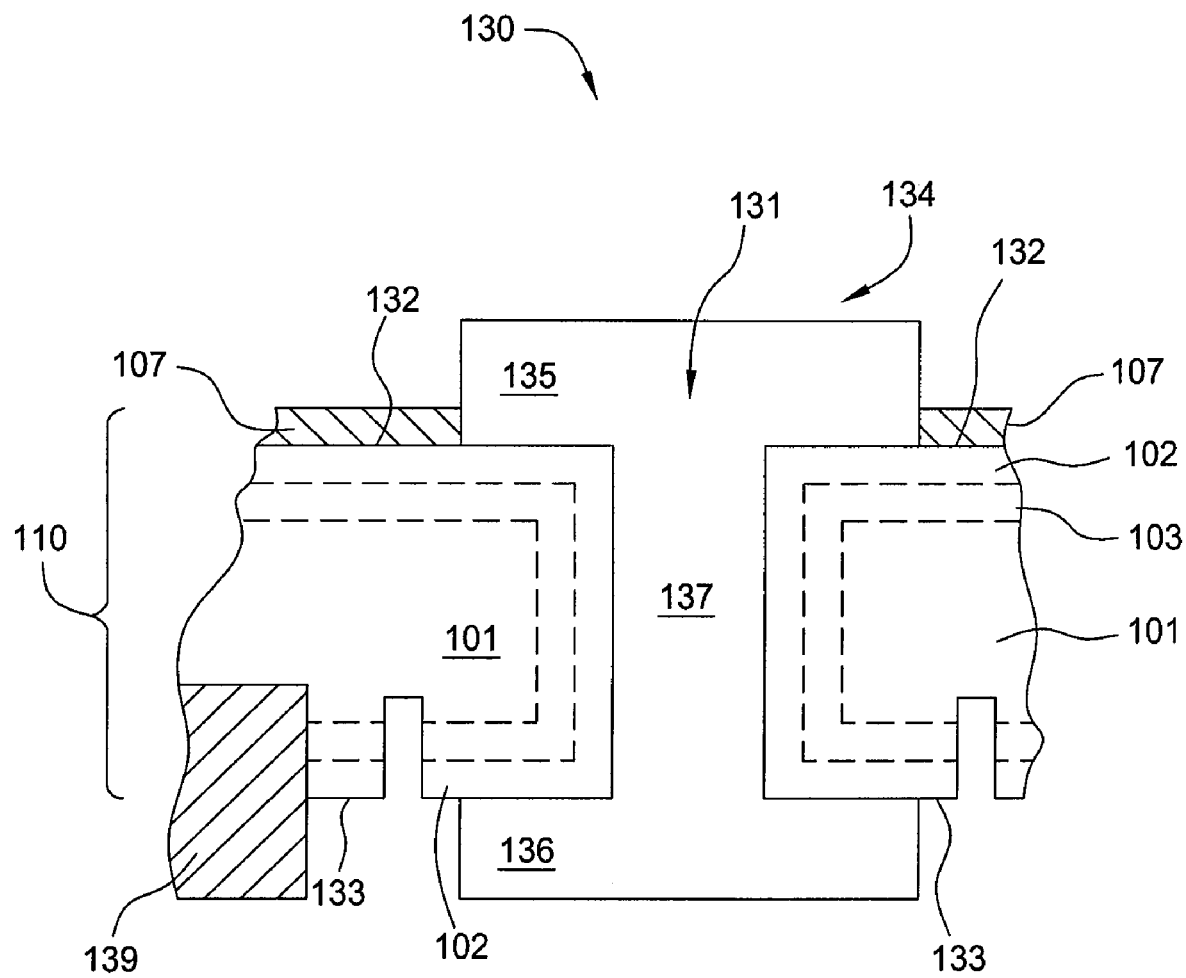
FIG. 1C illustrates a cross-sectional view of a prior art PUM type device.
Figure 1D:
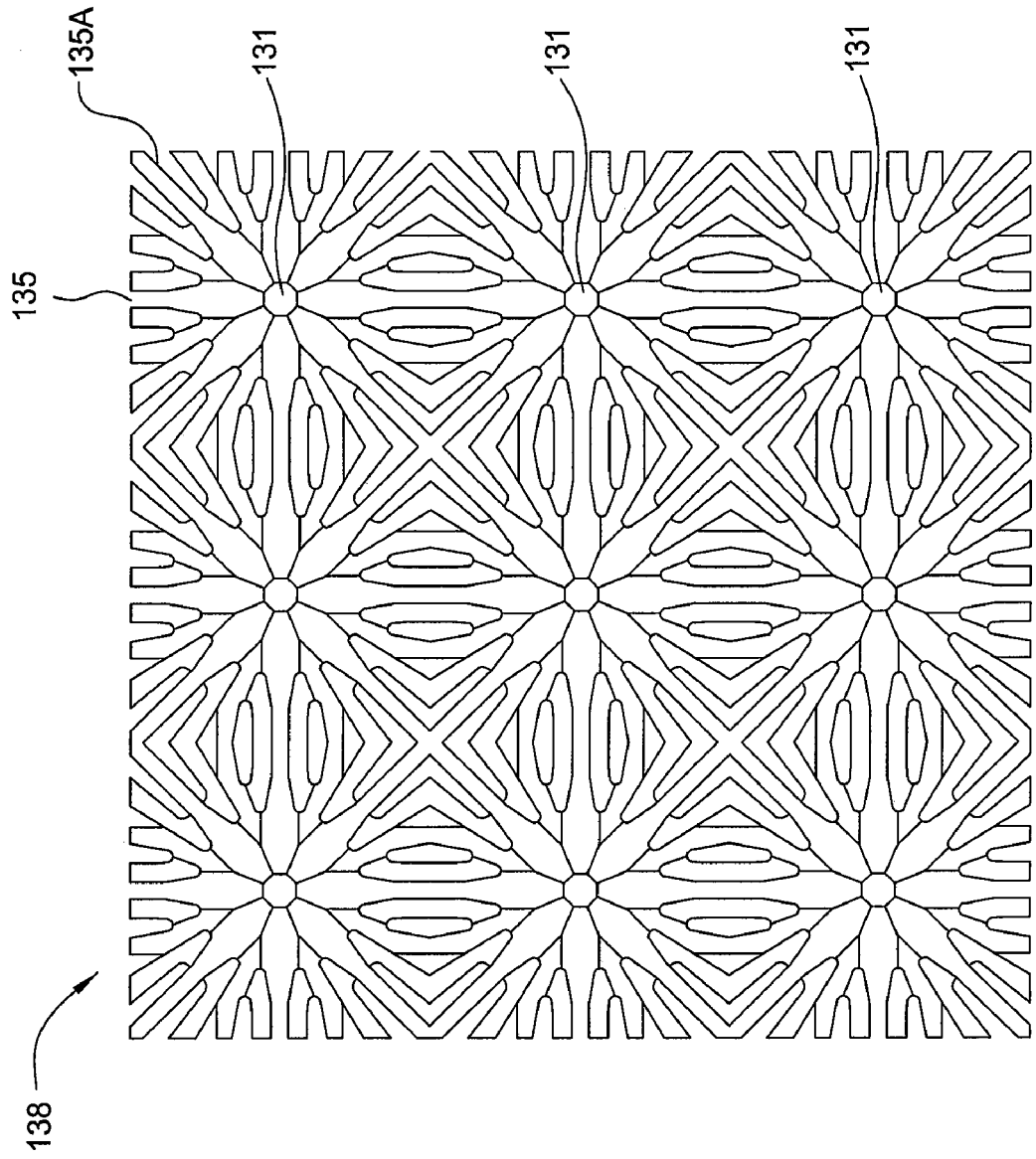
FIG. 1D illustrates a plan view of a top contact structure of a PUM cell, wherein the finger width and geometry have been optimized to maximize cell efficiency.
Figure 2:
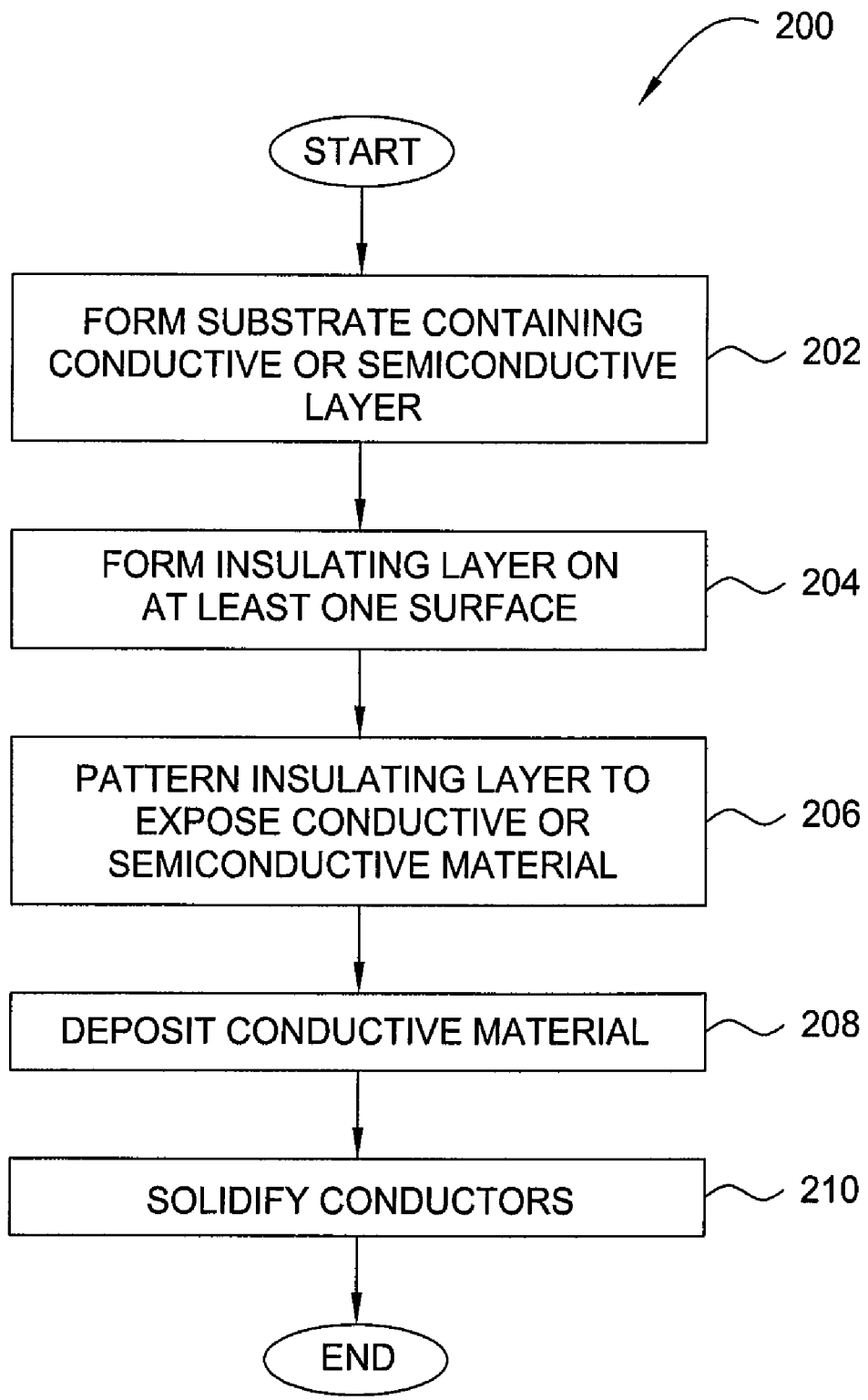
FIG. 2 illustrates a solar cell process sequence according to one embodiment described herein.

FIG. 2 is a process flow diagram that illustrates a series of method steps 200 that are used to form contact structures on a solar cell device using the apparatus described herein. The processes described below may be used to form a solar cell having interconnects formed using any conventional device interconnection style or technique. Thus while the embodiments described herein are discussed in conjunction with the formation of a device that has the electrical contacts to the n-type and p-type junctions on opposing sides of the substrate this interconnect configuration is not intended to be limiting as to the scope of the invention, since other device configurations, such as PUM, multilayer buried contact structures, back-surface contacts (both electrical contacts on one side), may be formed using the apparatus and methods described herein without varying from the basic scope of the invention.

Figure 3A:
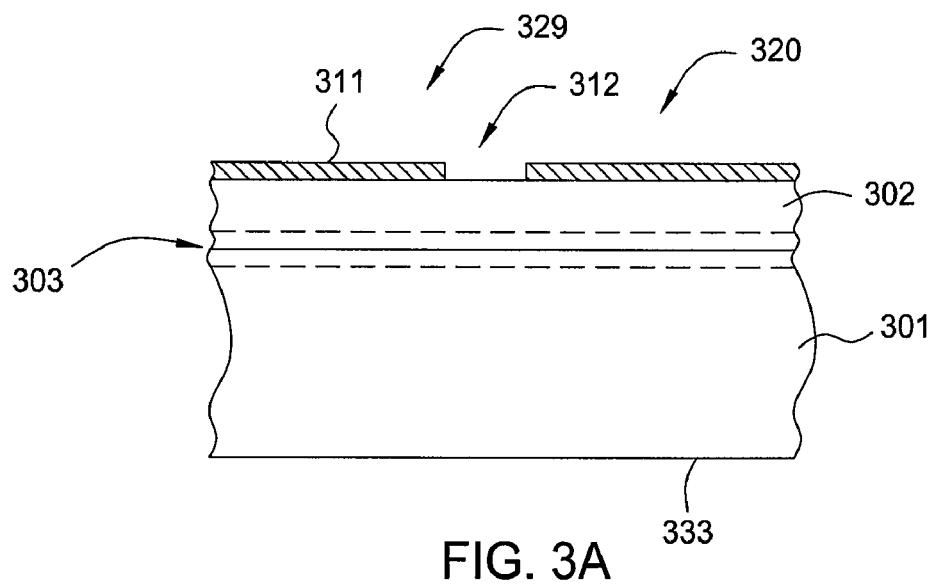
FIGS. 3A-3C illustrate schematic cross-sectional views of a solar cell during different stages of the process sequence described in FIG. 2.
Figure 3B:
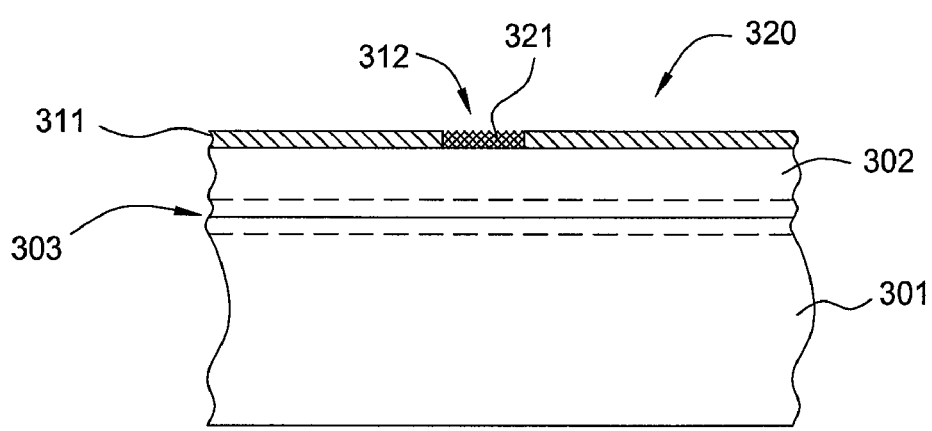
Figure 3C:
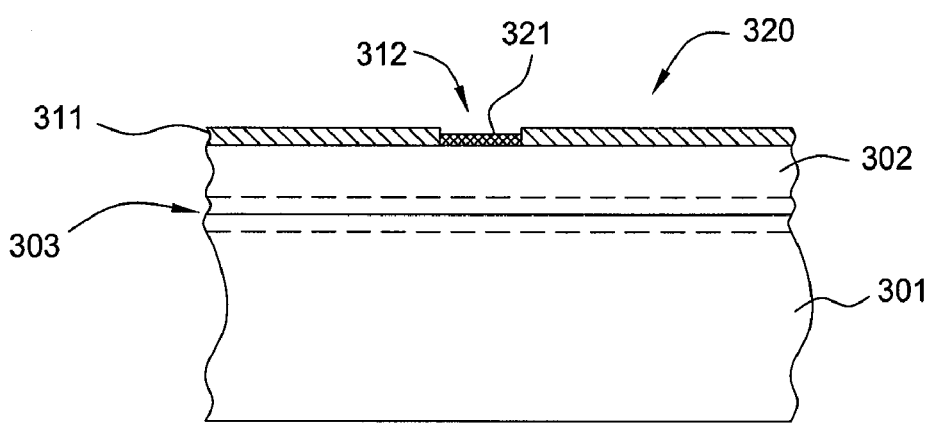

FIGS. 3A-3C illustrate the various states of a metallized substrate 320 after each step of method steps 200 has been performed. The method steps 200 start with step 202 in which a substrate 301 (FIG. 3A) is formed using conventional solar cell and/or semiconductor fabrication techniques. The substrate 301 may be formed from single crystal or polycrystalline silicon materials, and may have conductive and semiconductive layers. Examples of these substrate fabrication process are the EFG process (Edge-defined Film-fed Growth) contained in U.S. Pat. No. 5,106,763, incorporated by reference herein in its entirety, the RGS (Ribbon Growth on Substrate) process contained in U.S. Pat. Nos. 4,670,096 and 5,298,109, incorporated by reference herein in their entirety, and the SSP ribbon process (Silicon Sheets from Powder) contained in U.S. Pat. Nos. 5,336,335, 5,496,446, 6,111,191, and 6,207,891, incorporated by reference herein in their entirety. In one example an n-type region 302 is disposed over the substrate 301 that has been doped with a p-type dopant. The n-type region 302 can be formed using conventional chemical vapor deposition (CVD) process, by implanting an n-type dopant using a diffusion furnace, or other similar doping or film deposition techniques. The formed p-n junction will form a p-n junction region 303.

In the next step, step 204, as shown in FIG. 2, an insulating layer 311 may be formed over desired regions of the substrate surface using a conventional selective deposition process, such as an electroless or selective CVD deposition process. The insulating layer 311, illustrated in FIG. 3A, prevents deposition on areas where such deposition may be unwanted. The insulating layer may be formed on one or both sides of the substrate, depending on the particular embodiment. In step 206, the insulating layer is patterned. Using a patterned insulating layer allows deposition of conductive lines on the substrate. Patterning of insulating layer 311 forms aperture 312, exposing n-type region 302. Patterning insulating layer 311 generally exposes conductive or semiconductive materials beneath the insulating layer. Thus, the patterned insulating layer 311 serves as a mask layer for the deposition processes described herein. In embodiments featuring an insulating layer on each side of the substrate, one or both may be patterned. Processes of the present invention are effective for deposition on both the front and back side of a substrate, if desired.

In the next step, step 208, as shown in FIG. 2, conductors are formed over exposed conductive or semiconductive portion of the substrate. Deposition may be electrochemical, electrostatic, or electrophoretic. FIG. 3B illustrates a plurality of conductive particles 321 formed in aperture 312 through an electrophoretic deposition process as described herein. The conductive particles are preferably deposited by a process of electrophoresis and are held in place by electrostatic forces. Substrate 320 is fully exposed to the processing medium from which the conductive particles are deposited. Such exposure may be accomplished by immersing the substrate in the medium or preferably by distributing the medium onto a surface of the substrate so that the entire surface is exposed to the medium. Substrate 320 may be exposed to the processing medium for an amount of time to deposit the desired amount of material, such as between about 10 seconds and about 10 minutes, e.g. 20 seconds. Substrates may be exposed to the processing medium one at a time or in batches. An electric field may be applied to speed the deposition process. Substrates patterned on both sides may be immersed in the processing medium to deposit conductive particles on both sides at the same time, or each side may be exposed to the processing medium in turn by distributing the processing medium across one side and then across the other side of the substrate. In embodiments such as this, it may be advantageous to hold conductive particles adhered to the substrate by use of an electric field.

In the next step, step 210, as shown in FIG. 2, conductive particles 321 in aperture 312 are solidified together in a high-temperature reflow process that results in solid conductors. Remnants of components of the processing medium used to deposit the metal particles evaporate or are combusted to yield conductive wires. Such removal step may accompany the reflow process or may precede it. Removal of sacrificial components of the processing medium may thus be done at the same temperature as the reflow process, or at a different temperature. If, as described below, a hydrocarbon fluid is used as the ambient fluid, it may be desirable to remove the residual fluid by evaporation prior to solidifying the conductors. This may be done in the same apparatus as the reflow process by heating the substrates to a first temperature for a predetermined first period of time to evaporate the hydrocarbon, then to a second temperature for a predetermined second period of time to solidify the conductor. Alternately, the removal step may be performed in a different apparatus from the reflow process.

The forgoing describes a complete process for forming conductors on a substrate. It should be noted, however, that under some circumstances, it may be desirable to perform processes that deposit multiple conductive species or deposit on more than one surface of a substrate. In a process for forming conductive contacts from multiple metal species, it may be advantageous to deposit a first conductive species according to the embodiment described above, followed by a second masking, deposition, and solidifying process to create conductors comprising a second conductive species. Subsequent cycles may be used to deposit on obverse surfaces, or if further conductive species are to be deposited.

Deposition Apparatus

Figure 4A:
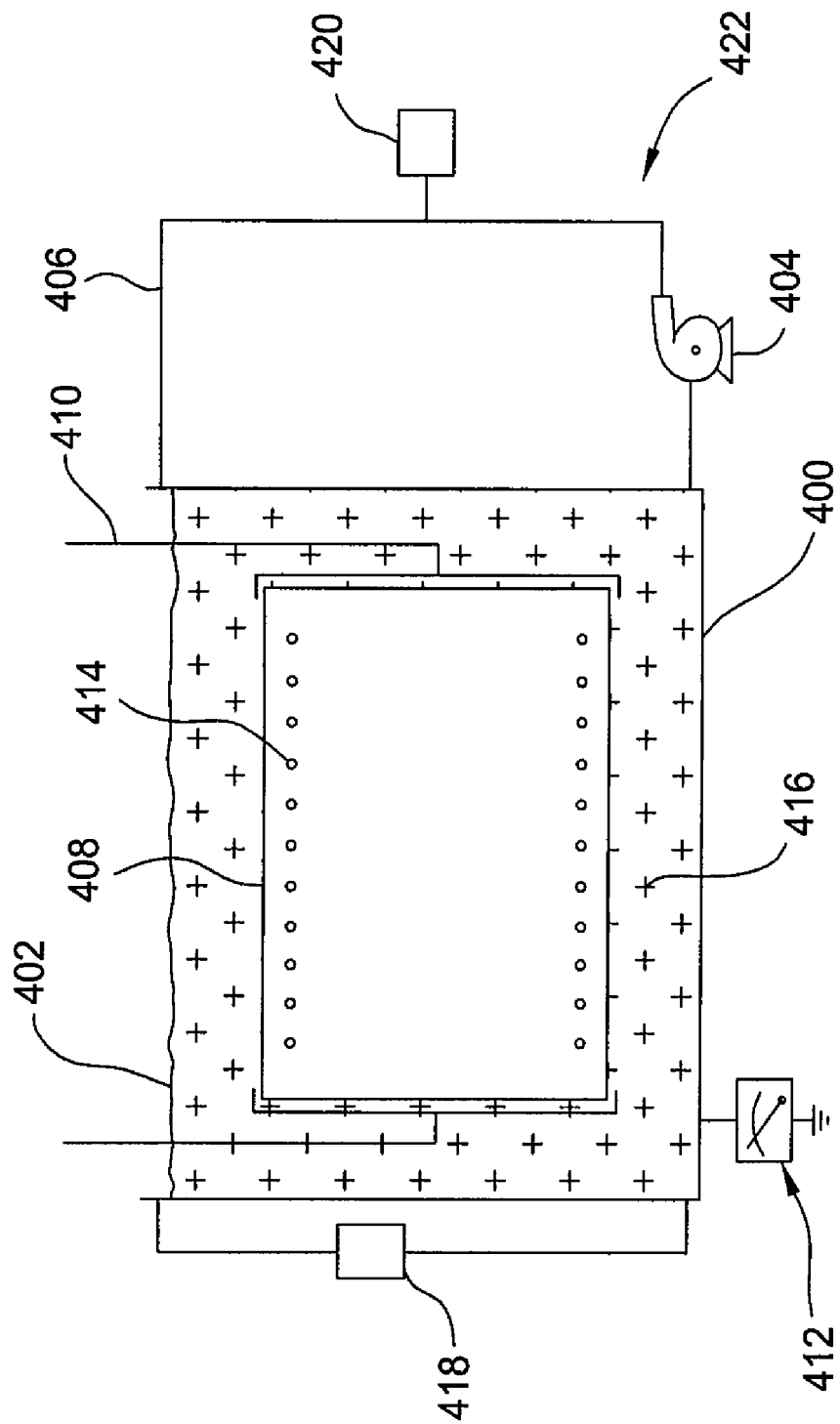
FIGS. 4A-4C are schematic diagrams of an apparatus according to one embodiment of the invention.
Figure 4B:
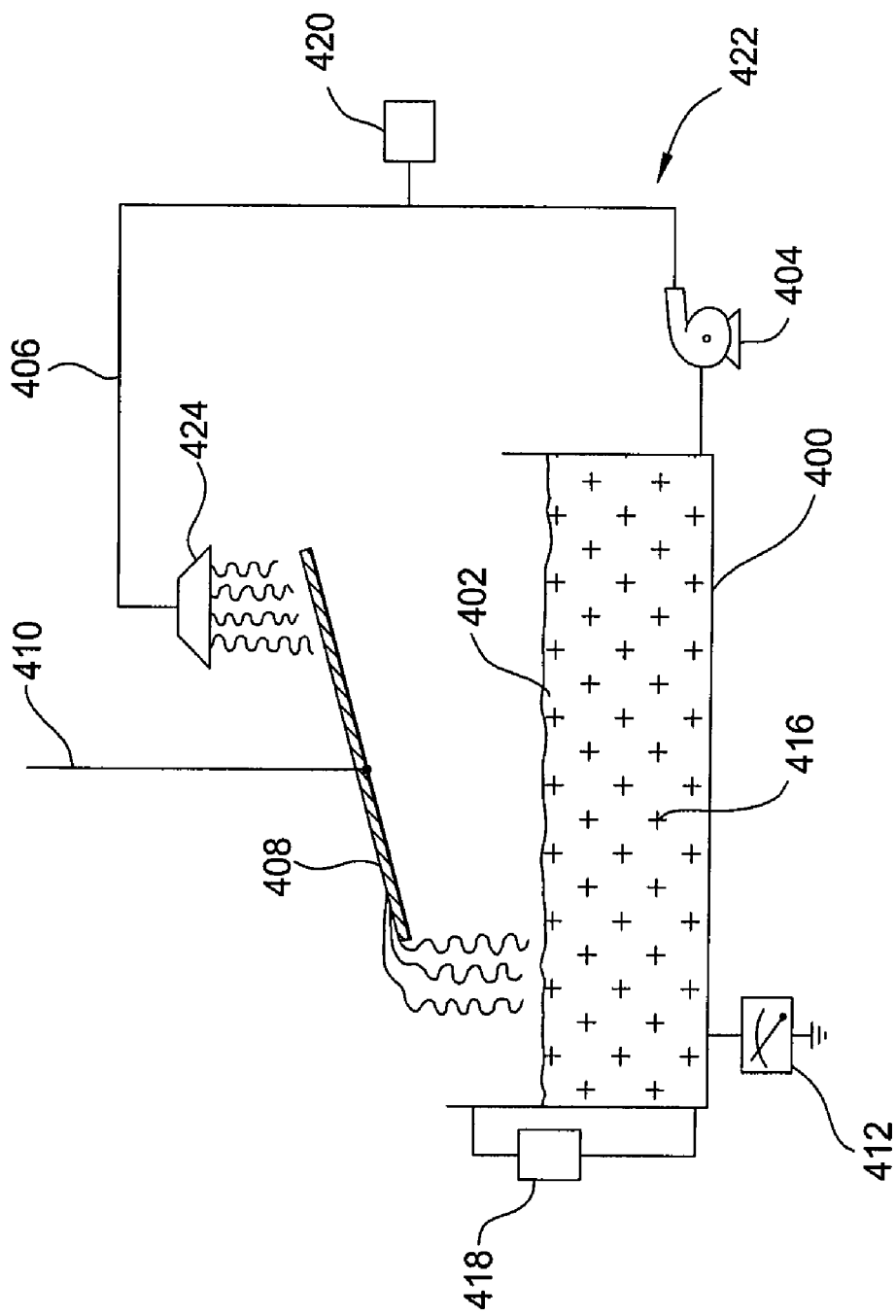
Figure 4C:
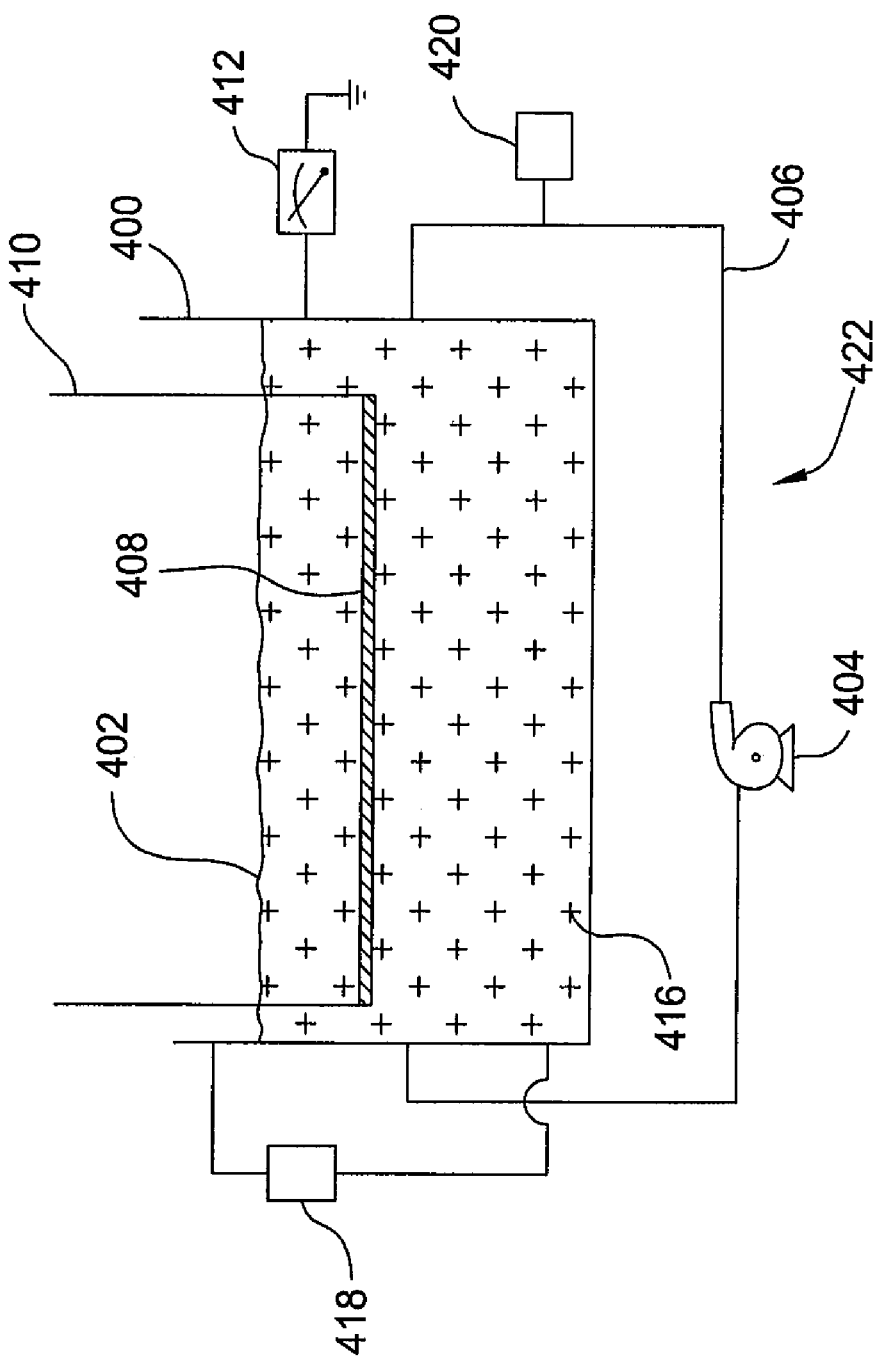

FIGS. 4A-4C illustrate an apparatus according to one embodiment of the invention. In FIG. 4A, a processing container 400 is provided in which a processing medium 402 is held. Processing container 400 may be a tank, and is preferably sized to accommodate at least one entire substrate. Processing medium 402 may be an electrolyte solution or preferably a dielectric suspension of charged conductive particles. A delivery system 422, containing at least a pump 404 and piping 406, pumps medium 402 around through piping 406 to container 400 to circulate the medium. A substrate 408 is held by substrate holder 410 in a position to facilitate exposure of substrate 408 to medium 402. Substrate holder 410 is preferably configured to hold substrate 408 in a fixed position during processing. Substrate 408 may be immersed in medium 402, as shown in FIGS. 4A and 4C, or it may be held above container 400 while medium 402 is distributed to a surface of substrate 408. In embodiments wherein electrical isolation of the substrate is desired, substrate holder 410 may be made of or coated with electrically insulating material. When grounding or other electrical coupling of the substrate is desired, holder 410 may be made of or coated with conductive material. In one embodiment, a grounded conductive substrate holder may promote electrostatic or electrophoretic deposition of conductive material onto substrate 408.

FIG. 4B illustrates an embodiment in which substrate 408 is held by substrate holder 410 in a position such that medium 402 can be distributed to one surface of the substrate. Piping 406 features a distributor 424 configured to apply processing medium across at least a portion of the surface of substrate 408. Preferably, distributor 424 is configured to apply processing medium across the entire surface of substrate 408. As shown in FIG. 4B, processing container 400 may be smaller in embodiments wherein substrate 408 is held outside the container. In such embodiments, container 400 may be a collection basin holding only enough fluid to feed pump 404. FIG. 4C illustrates an alternate embodiment in which substrate 408 is immersed in medium 402 horizontally, preferably face-up, and medium 402 is caused to flow across substrate 408 from one side of container 400 to the other by the pumping action of pump 404. Apertures 414 in substrate 408 expose conductive or semiconductive materials at points on which conductors are to be formed. If an electrolyte solution is used, substrate 408 must be electrically biased relative to an electrode, not shown. If a dielectric suspension is used, charged conductive particles 416 in solution 402 are attracted to apertures 414 in substrate 408 by a difference in electric potential of particles 416 and substrate 408, and are held in place by electrostatic forces.

A controller 412 may optionally be provided to monitor of electric potential of medium 402, if convenient. Controller 412 may be a potentiometer in some embodiments. A controller 418 may optionally be provided to monitor volume of processing medium 402 in container 400. In some embodiments, controller 418 may be a pressure differential instrument. Those skilled in the art will recognize other instruments applicable to monitoring volume of a medium in a container. Finally, a controller 420 may optionally be provided to monitor composition of processing medium 402. As deposition proceeds, deposited species are removed from the processing medium. If the concentration of deposition species in the processing medium is not maintained by electrochemical processes it must be maintained by physical processes. Monitoring composition with controller 420 may be helpful in this regard.

If a dielectric suspension is used as the processing medium 402, the suspended particles 416 may be electrostatically charged, or an electrical bias applied to substrate 408 with an electrode, or both. Conductive particles may be charged by immersing them in a dielectric fluid to form a dielectric suspension. Medium 402, for example, may be formed by dispersing conductive particles in a dielectric fluid. Conductive particles may comprise metal, such as copper or aluminum, or other metals or alloys discussed above. Conductive particles may also comprise particles of one metal or alloy coated with a different metal or alloy. The dielectric fluid is preferably an electrically insulating fluid with low dielectric constant, vapor pressure, toxicity, and viscosity. A fluid with resistivity higher than about $10^{11}$ Ω-cm and dielectric constant less than about 3.5 is preferred. Such a fluid may comprise a hydrocarbon, such as Isopar™ or Norpar™, available from ExxonMobil Corporation, Shell-Sol™ or Sol-Trol™, available from Shell Chemicals, other higher aliphatic or aromatic hydrocarbons or naphthas, or any other fluid with the desired properties.

Tank 400, pump 404, and piping and valves 406 are preferably all lined with an insulating material, such as plastic. This plastic lining may be TEFLON™ or any other plastic material. Glass or ceramic may also be used as a non-conductive lining. As processing medium 402 is pumped through lined pump 404 and piping and valves 406, static charge builds due to frictional charging. Conductive particles may be added to the dielectric fluid prior to charging or preferably after charging. The static charge localizes on the conductive particles dispersed in medium 402. If an electrode is not used, a static charge giving rise to a bulk electrostatic potential higher than 10 kV is preferred, such as between about 15 kV and about 20 kV. Individual electrically charged particles are attracted to exposed conductive or semiconductive portions of substrate 408, for example through apertures 414, to deposit on the substrate. An electrode may be used in combination with electrostatic charging to accelerate deposition. Use of an electrode in combination with a dielectric suspension, as described above, may also enable deposition without prior charging of the medium. A dielectric fluid may be charged in other ways, such as passage through a high voltage nozzle, passage between plates of a capacitor, bubbling a charged gas through the fluid, or any other method of applying electrostatic charge to a dielectric fluid or dielectric suspension of conductive particles.

In a single-cell process embodiment using a dielectric fluid with conductive particles as the processing medium, pumping the processing medium continuously through piping 406, as described above in the illustrated embodiment, will maintain a static charge on the dispersed conductive particles. Charging may be monitored using a controller of convenient design, such as a potentiometer. Substrates may be exposed to the processing medium one after another in a semi-continuous deposition process or in batches. As conductive material is depleted from the processing medium, more must be added continuously to maintain deposition rate. In embodiments that do not feature electrochemical processes, the addition must be by physical processes. In some embodiments, composition of the processing medium may be monitored by an analyzer 420, for example an orifice meter correlated to specific gravity, to determine the rate at which material must be added. Over time, the ambient portion of the processing medium will also be depleted by evaporating or by adhering to substrates as they are transported to a solidifying apparatus. Instrument 418 may be used to determine when more ambient material must be added to the processing medium.

Other embodiments of single-substrate processing systems are contemplated. One such apparatus incorporates a substrate carrier to transport substrates between and within processing stations. Substrates may be exposed to processing medium one or more times while being carried through the processing apparatus. The same carrier may then transport substrates to drying and/or reflow stations. Multiple substrates may thus be carried, one after the other, through the various steps of the process. A conveyor is an example of a substrate carrier that may be used in some embodiments. Substrates may be carried by a conveyor past one or more distributors 424. Each distributor may deliver different processing media to enable stage-wise deposition of different materials, if desired. Each processing station may be independently energized with an electric field, if so desired, to aid deposition. Deposited materials may be solidified in a single reflow station after all deposition is complete, or reflow stations may be interspersed between deposition stations or other processing stations. In some embodiments, conveyors may be configured to provide more than one substrate to a single processing station at one time.

Processing Medium

In general, it is desirable to form a conductor 321 that is defect free, has a low stress that can fill any deep features formed on the substrate surface from the bottom-up. The process performed in container 400 utilizes a processing medium that may be an electrolyte solution, or is preferably a dielectric suspension of conductive particles. The conductive particles may be a metal or alloy powder, such as SAC305 alloy, silver/tin powder, nickel powder, aluminum powder, and combinations thereof, including particles of one metal or alloy coated with a second metal or alloy, such as tin-coated copper particles. Particle size of the conductive particles preferably range from 3 microns to 50 microns. In some embodiments, the conductive particles may be coated with an insulating materials, such as an oxide layer or resin coating, to enhance development of electrostatic charge. In some cases one or more additives, such as a charging agent or flux may be used to facilitate the deposition process, or subsequent fusing processes. For example, a charging agent may facilitate development of electrostatic charge on the particles dispersed in the processing medium. Charging agents that may be used are preferably metal sulfonates, such as barium PETRONATE™ or calcium PETRONATE™, both available from Chemtura Corporation, of Middlebury, Conn., but may be metal carboxylates, alkali metal soaps, block copolymers, fatty amines, zwitterionic compounds, polymeric esters, or combinations thereof.

In some embodiments, it may be desirable to impart an electric charge to the processing medium. This may be done by pumping the processing medium through piping and valves designed to generate the electric charge. For example, a non-conductive fluid may be pumped through piping lined with a non-conductive material to generate an electric charge in the fluid by friction. Conductive particles, with or without a charge-promoting coating, may then be suspended in the fluid to create a processing medium. If the particles are bare conductive particles with no non-conductive coating, the charge from the fluid will be imparted to the particles. The non-conductive fluid may be charged in alternative ways, such as passing through a high-voltage nozzle, passing between the plates of a capacitor, or bubbling a charged gas through the fluid. In other embodiments, the charge may be imparted after dispersing the conductive particles in the fluid.

The substrate may be exposed to a processing aid, which may be a flux, to facilitate fusing processes following deposition. It has been found that flux facilitates formation of low resistivity contacts by promoting wetting of liquid metal on conductive surfaces and by minimizing void spaces in solidified contacts. The substrate may be exposed to flux before or after exposure to the processing medium, but best results have been obtained by doing both. Whereas applying flux to the substrate after exposure to the processing medium may result in voids up to 35% after sintering, applying flux before exposure to the processing medium may reduce voids to 10%, and applying both before and after may reduce void formation even further. Fluxes must be matched to the character of the ambient processing fluid. For example, in a hydrocarbon fluid ambient, an organic flux, such as abietic acid or another rosin-based flux, may be useful.

Batch Apparatus

Figure 5A:
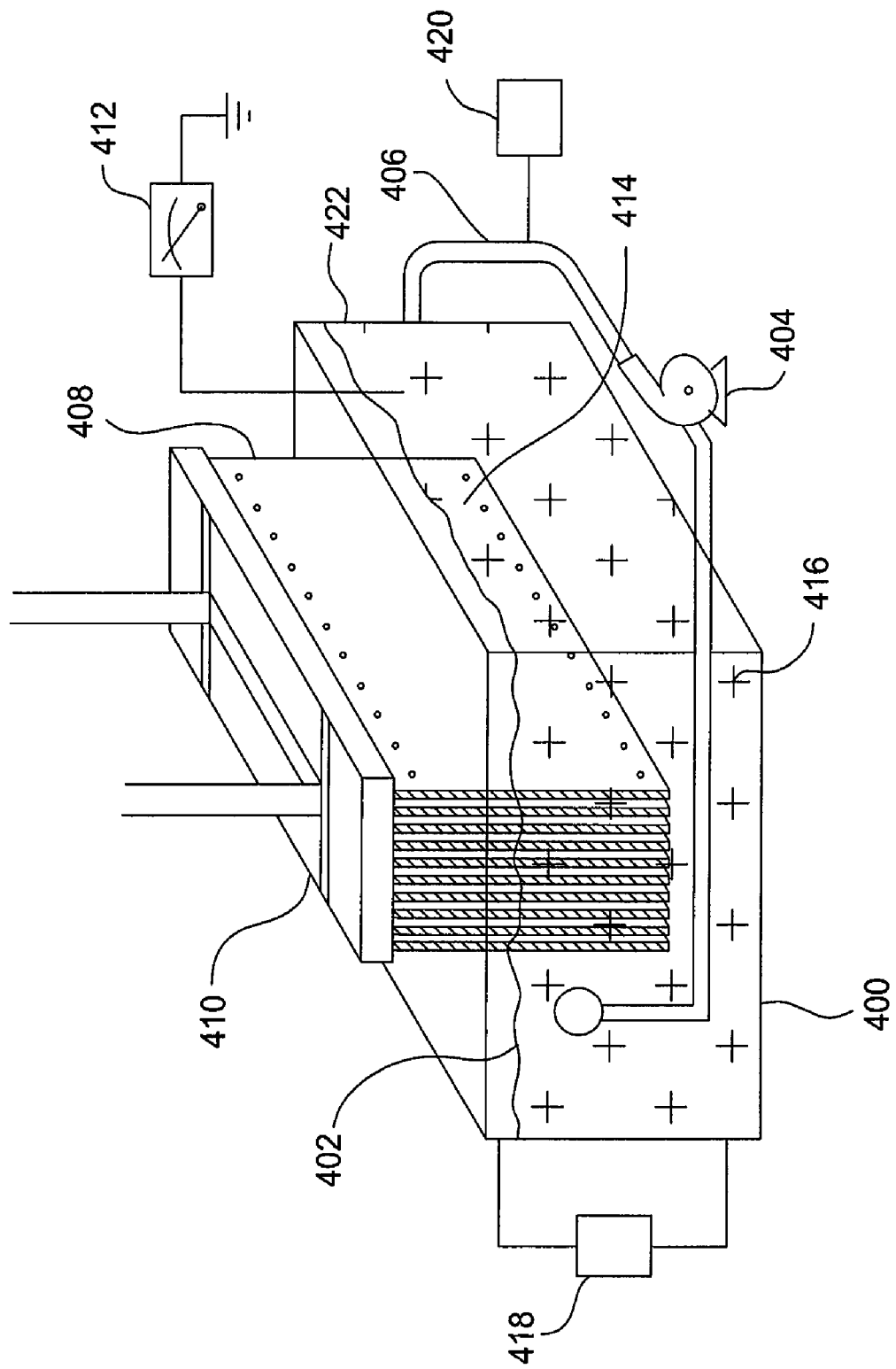
FIG. 5A is an isometric view of an apparatus for processing solar cell substrates according to one embodiment of the invention.
Figure 5B:
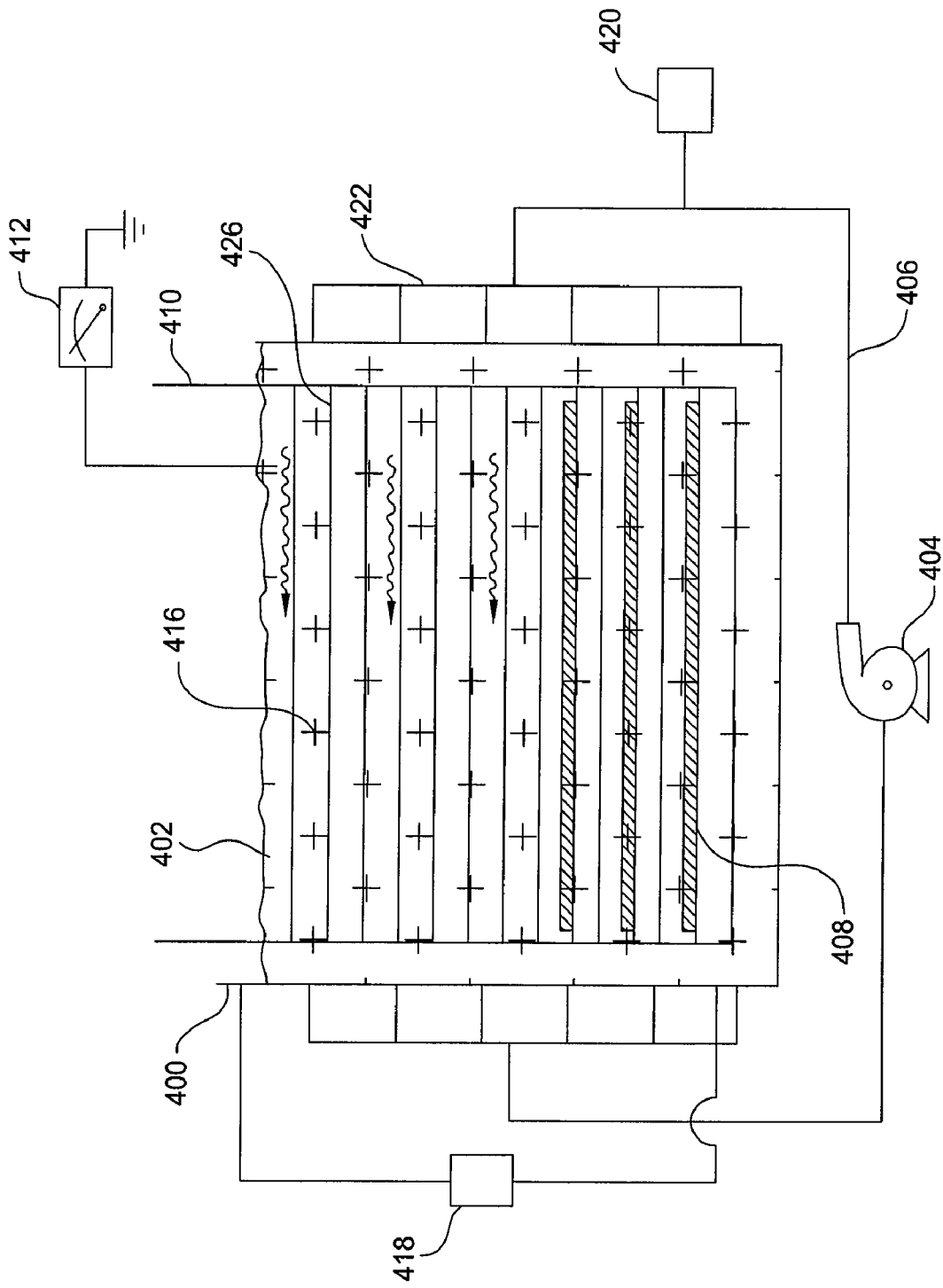
FIG. 5B is a cross-sectional side view of an apparatus for processing solar cell substrates according to one embodiment of the invention.

FIGS. 5A and 5B illustrate alternative apparatus embodiments that may be used to process multiple substrates at the same time. FIG. 5A shows an embodiment in which multiple substrates are immersed in a processing medium by dipping. Container 400 is sized to accept the desired number of substrates 408. Although in this embodiment substrates 408 are shown partially immersed in processing medium 402, total immersion is also contemplated wherein holder 410 is partially or fully immersed in processing medium 402 as well. In some embodiments, substrate holder 410 may comprise a plurality of edge grippers, one for each substrate. Holder 410 may also comprise a single edge gripping device for all substrates. Holder 410 may also be configured to grip substrates along their entire length through any known means, such as friction, vacuum, or electrostatic means. Delivery system 422 is shown in a configuration designed to create flow of processing medium 402 longitudinally across substrates 408. As above, delivery system 422 and container 400 may optionally be lined with non-conductive material to facilitate frictional charging of particles 416. In alternate embodiments, however, particles 416 may be electrically neutral, and an electric field may be applied to medium 402 to encourage deposition. Charging may also be accomplished by other ways as described above.

FIG. 5B illustrates another embodiment for processing multiple substrates. Similar elements are labeled with similar numbers. In this embodiment, substrate holder 410 features trays 426 for carrying multiple substrates. Each substrate rests on a tray, and the trays are exposed to the processing medium 402. Delivery system 422 and piping 406 are configured to cause processing medium 402 to flow across substrates 408 to achieve uniform deposition. The apparatus in FIG. 5B is preferably operated without an additional applied electric field to maximize uniformity of deposition. Trays may be solid, perforated, or edge supports.

While the foregoing is directed to embodiments of the present invention, other and further embodiments of the invention may be devised without departing from the basic scope thereof, and the scope thereof is determined by the claims that follow.

What is claimed is:

1. An apparatus for processing semiconductor substrates, comprising:
    a processing container for a liquid processing medium, the processing container having an internal surface exposed to the processing environment;
    a substrate holder configured to contact a substrate with the liquid processing medium; and
    a delivery system for delivering the liquid processing medium to the processing container, wherein the delivery system is configured to generate electrostatic charge in the processing medium, wherein the delivery system is configured to deliver the liquid processing medium to one side of the substrate, and wherein the delivery system comprises a pump, a discharge pipe, and a distributor, wherein the distributor is positioned to deliver the liquid processing medium evenly across the one side of the substrate.

2. An apparatus for processing one or more substrates, comprising:
    one or more processing stations, each of which defines a processing region;
    one or more substrate holders, each of which is configured to hold and transport the one or more substrates among the one or more processing stations; and a delivery system for providing one or more liquid processing media to the one or more processing stations, wherein the delivery system is configured to generate electrostatic charge in the one or more liquid processing media, wherein the delivery system comprises piping, valves, and at least one pump, all lined with an electrically insulating material.

3. An apparatus for processing one or more substrates, comprising:

one or more processing stations, each of which defines a processing region;

one or more substrate holders, each of which is configured to hold and transport the one or more substrates among the one or more processing stations; and a delivery system for providing one or more liquid processing media to the one or more processing stations, wherein the delivery system is configured to generate electrostatic charge in the one or more liquid processing media, wherein the one or more processing stations comprise at least one deposition station and at least one reflow station.

4. The apparatus of claim 3, wherein each of the one or more substrate holders is a conveyor.

5. The apparatus of claim 4, wherein the delivery system comprises piping, valves, at least one pump, and at least one distributor configured to dispense the one or more processing media onto the one or more substrates.

* * * * *